(12) United States Patent
Shinozaki

(10) Patent No.: US 6,440,320 B1
(45) Date of Patent: Aug. 27, 2002

(54) SUBSTRATE PROCESSING METHOD AND APPARATUS

(75) Inventor: Hiroyuki Shinozaki, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 136 days.

(21) Appl. No.: 09/684,392

(22) Filed: Oct. 10, 2000

(30) Foreign Application Priority Data

Oct. 13, 1999 (JP) .............................. 11-290784

(51) Int. Cl.$^7$ .............................. B44C 1/22; C03C 15/00
(52) U.S. Cl. .................... 216/90; 156/345; 134/34; 134/184; 134/902; 118/118; 118/52; 118/56; 118/319; 427/240
(58) Field of Search ................ 156/345; 216/90; 134/34, 902, 184; 118/52, 56, 319, 320; 427/240; 34/629

(56) References Cited

U.S. PATENT DOCUMENTS 4,544,446 A * 10/1985 Cady .......................... 134/149

6,273,104 B1 * 8/2001 Shinbara et al. ......... 134/102.1

FOREIGN PATENT DOCUMENTS

JP 7-58036 3/1995

* cited by examiner

*Primary Examiner*—Randy Gulakowski
*Assistant Examiner*—Shamm Ahmed
(74) *Attorney, Agent, or Firm*—Armstrong, Westerman & Hattori, LLP

(57) ABSTRACT

A substrate processing method and apparatus capable of uniformly supplying a processing liquid to a substrate surface in substrate processing such as development processing without exerting an influence on the physical properties of the processing liquid and without damaging the substrate. A rotating blade is disposed above the horizontally placed substrate so as to face the substrate. The processing liquid is supplied to the surface of the substrate, and the rotating blade is rotated while being kept out of contact with the processing liquid to induce a gas current. The gas current forms a mass of processing liquid having an internal circulating current on the substrate surface below the rotating blade.

6 Claims, 5 Drawing Sheets

SUBSTRATE PROCESSING METHOD AND APPARATUS

BACKGROUND OF THE INVENTION

The present invention relates to substrate processing method and apparatus for processing a surface to be processed of a substrate with a processing liquid. More particularly, the present invention relates to a substrate processing method and apparatus suitable for use in a coating process for forming a thin film on a substrate or in an etching process for thinly removing the surface of a substrate in semiconductor manufacturing processes.

In semiconductor device manufacturing processes, various processing operations using processing liquids are performed on substrate surfaces to be processed. In such a case, it is necessary to uniformly supply processing liquids to the processing surface of the substrate. For example, to coat a substrate surface with a resist uniformly and to uniformly effect development after exposure, it is necessary that processing liquids used in the resist coating process and the developing process be supplied uniformly to the substrate surface. In the developing process in particular, the development processing area per unit area of the substrate varies from place to place to a considerable extent, depending on the exposure pattern (i.e. in a region where the development area is large, the concentration of the developing solution is likely to be reduced, while in a region where the development area is small, the concentration of the developing solution is likely to be increased, resulting in a large difference in concentration from region to region). Therefore, it is difficult to carry out development processing uniformly.

SUMMARY OF THE INVENTION

In view of the above-described problem, an object of the present invention is to provide substrate processing method and apparatus capable of uniformly supplying a processing liquid having a uniform concentration to a substrate surface in substrate processing such as development processing without affecting the physical properties of the processing liquid and without damaging the substrate.

To attain the above-described object, the present invention provides substrate processing method and apparatus for processing a surface of a substrate with a processing liquid. The substrate is placed horizontally, and a rotating blade is disposed above the substrate so as to face it. The processing liquid is supplied to the surface of the substrate, and the rotating blade is rotated while being kept out of contact with the processing liquid to induce a gas current over the processing liquid. The gas current forms a mass of processing liquid having a surface current and an internal circulating current on the surface of the substrate.

As stated above, the rotating blade disposed to face the substrate is rotated while being kept out of contact with the processing liquid, thereby inducing a gas current over the processing liquid. The gas current forms a mass of processing liquid having a surface current on the substrate surface below the rotating blade. The surface current induces an internal circulating current in the mass of processing liquid. As a result, the processing liquid can be supplied uniformly to the substrate surface by the internal circulating current. Furthermore, because the processing liquid is stirred by the internal circulating current, it is possible to dissolve a concentration difference in the processing liquid that occurs as the processing progresses and hence it is possible to uniformize the concentration. In addition, because the substrate is placed in a stationary state and the rotating blade rotates out of contact with the processing liquid, the substrate is not shocked or stressed. Accordingly, there is no likelihood of the substrate being damaged.

Preferably, the rotating shaft of the rotating blade and the rotor of a motor for driving the rotating blade are supported with magnetic bearings.

When the rotating shaft of the rotating blade and the rotor of the motor for driving the rotating blade are supported in a magnetic levitation manner with magnetic bearings, there is no possibility that the substrate or the processing space will be contaminated with particles or the like that would otherwise be generated by friction.

The substrate processing method or apparatus may include a step or device for moving the rotating blade in parallel to the substrate.

By moving the rotating blade parallel to the substrate, the gas current induced by the rotating blade also moves along with the movement of the rotating blade, therefore, the mass of processing liquid formed by the gas current on the substrate surface below the rotating blade also moves on the substrate surface as the rotating blade moves. Therefore, even a large-sized substrate can be uniformly processed over the whole surface thereof.

Preferably, the rotating blade is a planar disk.

The rotating blade in the shape of a planar disk makes it easy to form a mass of processing liquid having an internal circulating current on the substrate surface below the rotating blade. That is, the rotating blade in the shape of planer disk does not form any downward gas current toward the substrate, which makes the formation of the gas current from the substrate toward the rotating blade easy; thus, the formation of the mass of processing liquid is also made easy.

The above and other objects, features and advantages of the present invention will become more apparent from the following description of the preferred embodiments thereof, taken in conjunction with the accompanying drawings.

DETAILED DESCRIPTION OF THE INVENTION

Embodiments of the present invention will be described below in detail with reference to the accompanying drawings.

Figure 1:
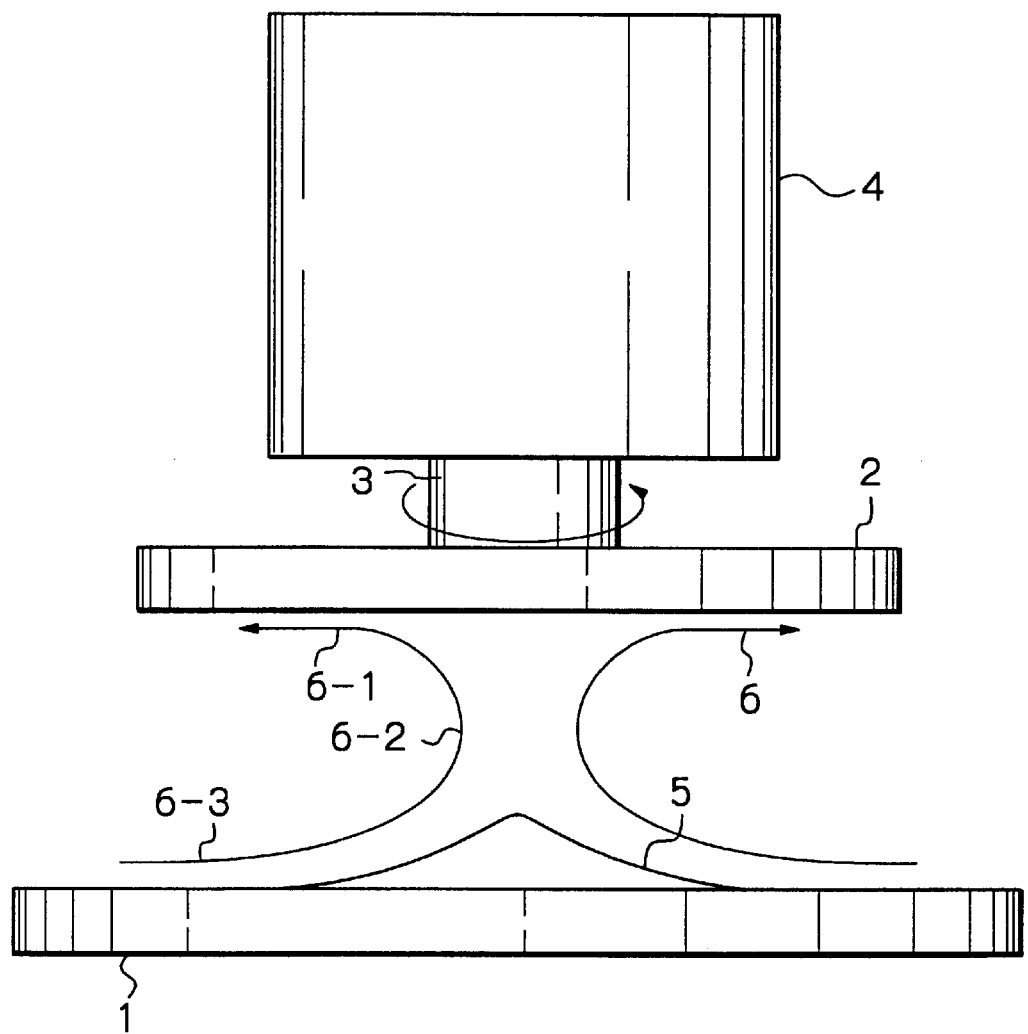
FIG. 1 is a diagram showing schematically a structural example of the substrate processing apparatus according to the present invention.

FIG. 1 is a diagram showing schematically a structural example of the substrate processing apparatus according to the present invention. Referring to FIG. 1, a substrate 1, e.g. a semiconductor wafer, is placed horizontally. A rotating blade 2 is disposed to face the substrate 1. The rotating blade 2 is secured to a rotating shaft 3 of a motor 4. Thus, the rotating blade 2 is rotated by the motor 4.

In the substrate processing apparatus with the above-described arrangement, when the rotating blade 2 is rotated, a gas current 6 is induced as shown in the figure. That is, the gas current 6 flows toward the center of the substrate 1 from the outer periphery thereof, ascends at the center of the substrate 1 and further flows toward the outer periphery of the rotating blade 2. That is, when the rotating blade 2 is rotated, a radially outward gas flow 6-1 along the lower surface of the rotating blade 2 is caused by the friction between the surface of the rotating blade and the gas and the centrifugal force acting on the gas. To fill the central portion of the rotating blade, an ascending gas flow 6-2 is caused at the central portion of the rotating blade 2, which in turn causes a radially inward gas flow 6-3 along the upper surface of the substrate 1. If a processing liquid is supplied to the upper surface of the substrate 1 in this state, the processing liquid is induced to form an approximately conical mass 5 of processing liquid by the gas current 6.

Figure 2:
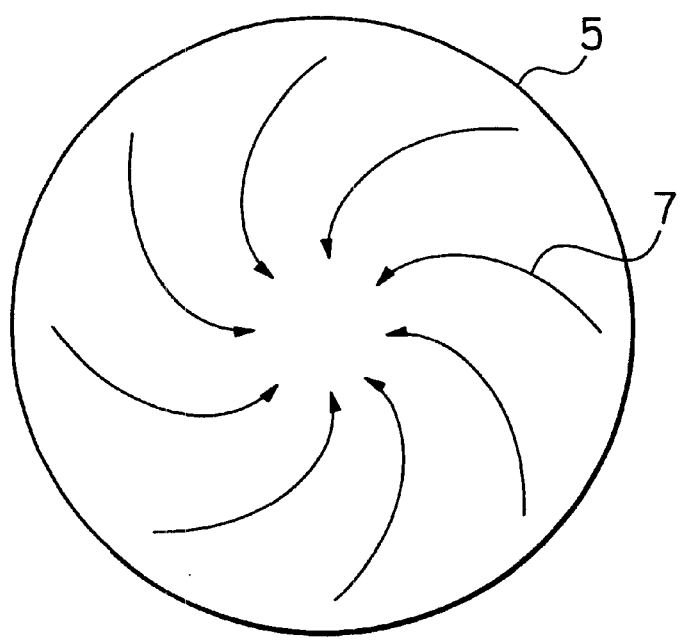
FIG. 2 is a diagram for illustrating a surface current in a mass of processing liquid formed in the substrate processing apparatus according to the present invention.
Figure 3:
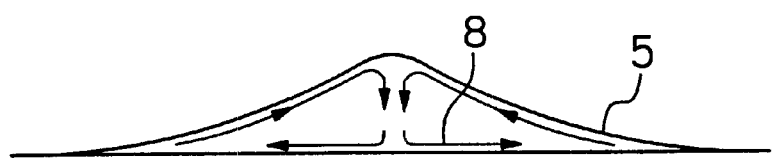
FIG. 3 is a diagram for illustrating an internal circulating current in a mass of processing liquid formed in the substrate processing apparatus according to the present invention.

As shown in FIG. 2, the conical mass 5 of processing liquid has a vortical surface current. 7 induced therein to flow toward the center of the mass 5 of processing liquid by the gas current 6. As shown in FIG. 3, the surface current 7 induces an internal circulating current 8 in the mass 5 of processing liquid. The circulating current 8 flows toward the center of the mass 5 of processing liquid from the outer periphery thereof, descends at the center and further flows on the upper surface of the substrate 1 toward the outer periphery from the center thereof. The circulating current 8 allows the processing liquid to be supplied uniformly to the upper surface of the substrate 1. Moreover, the processing liquid is stirred by the stirring action of the circulating current 8. Thus, it is possible to dissolve a concentration difference in the processing liquid that occurs as the processing progresses.

Figure 4:
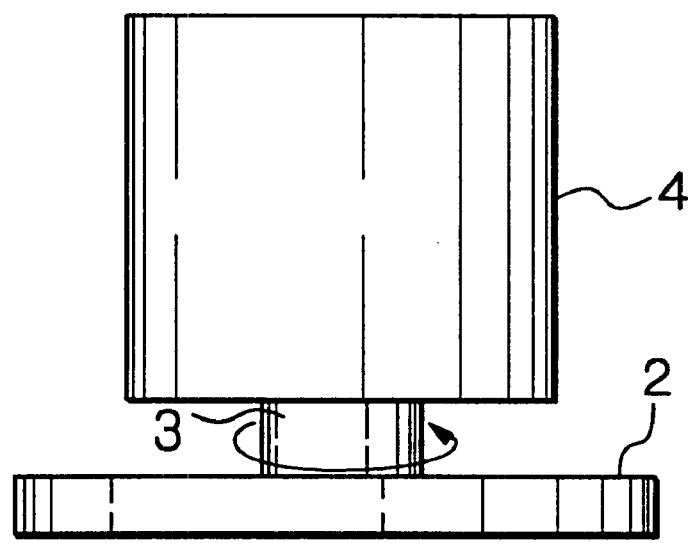
FIG. 4 is a diagram showing formation of a mass of processing liquid of the same size as the substrate size in the substrate processing apparatus according to the present invention.
Figure 4:
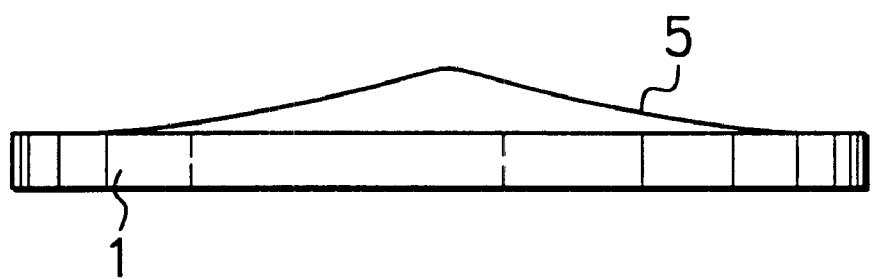

The diameter of the conical mass 5 of processing liquid can be controlled at will by the configuration of the rotating blade 2, the number of revolutions of the rotating blade 2 and the distance between the rotating blade 2 and the substrate 1. Accordingly, the mass 5 of processing liquid can be formed with the same diameter as the diameter of the substrate 1 as shown in FIG. 4. Thus, the processing liquid having a uniform concentration can be supplied uniformly to the whole surface of the substrate 1, and the whole surface of the substrate 1 can be processed uniformly.

The rotating blade 2 may have a general blade structure in which wing-shaped blades are provided in a side-by-side relation to each other on the lower side of a plate. However, as stated above, the rotating blade 2 in the shape of a planar disk allows the mass 5 of processing liquid to be readily induced as shown in FIGS. 1 to 3.

Figure 5:
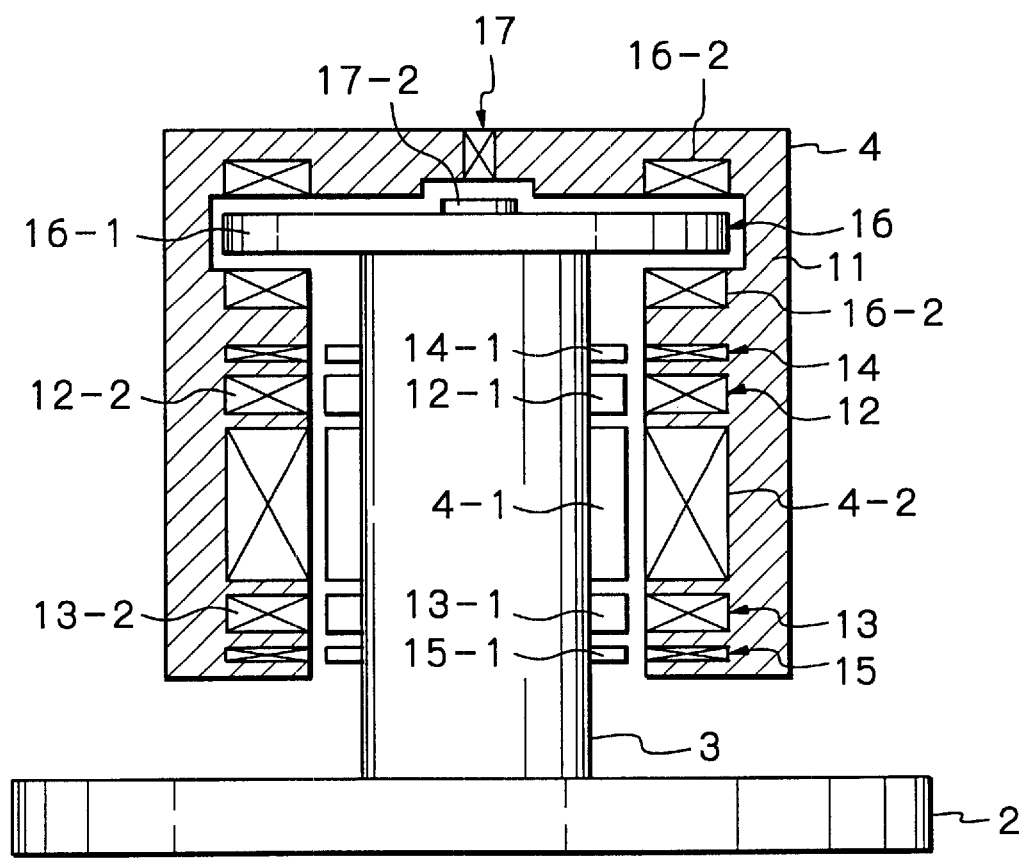
FIG. 5 is a diagram showing a structural example of a motor used in the substrate processing apparatus according to the present invention.

FIG. 5 is a diagram showing a structural example of a motor for driving the rotating blade 2. As illustrated in the figure, the rotating shaft 3 of the motor 4 and the rotating shaft of the rotating blade 2 are integrated into one rotating shaft. A rotor 4-1 of the motor 4 is secured to the rotating shaft 3. A stator 4-2 of the motor 4 is disposed to face the outer periphery of the rotor 4-1 and secured to a casing 11. Rotors 12-1 and 13-1 of radial magnetic bearings 12 and 13 are secured to the rotating shaft 3. Stators 12-2 and 13-2 of the radial magnetic bearings 12 and 13 are disposed to face the outer peripheries of the rotors 12-1 and 13-1, respectively, and secured to the casing 11. In addition, radial gap sensors 14 and 15 are mounted on the casing 11. Targets 14-1 and 15-1 of the radial gap sensors 14 and 15 are secured to the rotating shaft 3.

A disk-shaped rotor 16-1 of an axial magnetic bearing 16 is secured to the upper end of the rotating shaft 3. Stators 16-2 of the axial magnetic bearing 16 are secured to the casing 11 so as to face the rotor 16-1. An axial gap sensor 17 is mounted on the casing 11, and a target 17-1 of the axial gap sensor 17 is secured to the center of the rotor 16-1.

The rotating shaft 3 is supported in a non-contact, magnetic levitation manner with two radial magnetic bearings 12 and 13 (upper and lower) and one axial magnetic bearing 16. On the basis of signals output from the radial gap sensors 14 and 15 and the axial gap sensor 17, a control unit (not shown) controls exciting currents to be supplied to the stators 12-2 and 13-2 of the radial magnetic bearings 12 and 13 and to the stators 16-2 of the axial magnetic bearing 16 so that the rotating shaft 3 assumes a predetermined proper position.

As stated above, the rotating shaft 3 is supported in a magnetic levitation manner with the radial magnetic bearings 12 and 13 and the axial magnetic bearing 16. Therefore, there is no possibility that the substrate 1 or the processing space will be contaminated with particles or the like that would otherwise be generated by friction. It should be noted that the structure of the motor 4 for driving the rotating blade 2 that is shown in FIG. 5 is merely an example and the present invention is not necessarily limited thereto. The essential thing is to support the rotating shaft of the rotating blade and the rotor of the motor in a non-contact manner with magnetic bearings.

Figure 6:
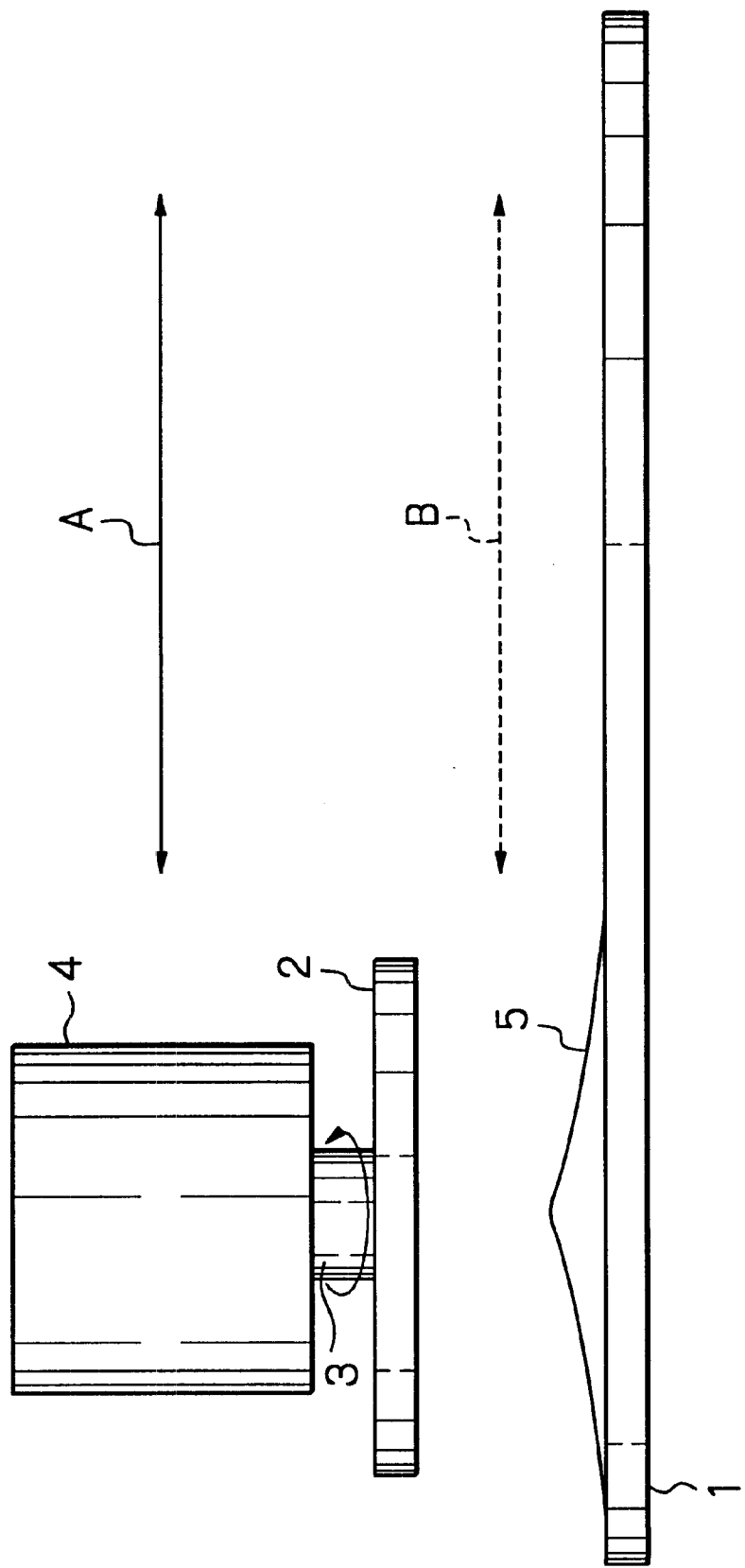
FIG. 6 is a diagram showing schematically another structural example of the substrate processing apparatus according to the present invention.

FIG. 6 is a diagram showing schematically an another structural example of the substrate processing apparatus according to the present invention. The illustrated substrate processing apparatus is applied to a large-sized substrate 1. The substrate processing apparatus has a device (not shown) for moving the rotating blade 2 and the motor 4 in parallel to the substrate 1. That is, the rotating blade 2 and the motor 4 can be moved in parallel to the substrate 1 in the direction of the arrow A by the moving device. As the rotating blade 2 is moved in the direction of the arrow A, the gas current 6 formed by the rotating blade 2 also moves along with the rotating blade 2 and, therefore, the conical mass 5 of processing liquid formed by the gas current 6 on the upper surface of the substrate 1 below the rotating blade 2 also moves in the direction of the arrow B. Thus, even if the size of the substrate 1 is large, the processing liquid having a uniform concentration can be supplied uniformly to the whole surface of the substrate 1. Accordingly, it is possible to process the whole substrate surface uniformly.

As has been stated above, the present invention provides the following advantageous effects.

According to the present invention, the rotating blade disposed to face the substrate is rotated while being kept out of contact with the processing liquid, thereby inducing a gas current. The gas current forms a mass of processing liquid having a surface current on the substrate surface below the rotating blade. The surface current induces a circulating current in the mass of processing liquid. As a result, the processing liquid can be supplied uniformly to the substrate surface. Furthermore, because the processing liquid is stirred by the circulating current, it is possible to dissolve a concentration difference in the processing liquid that occurs as the processing progresses and hence it is possible to uniformize the concentration. In addition, because the substrate is placed in a stationary state and the rotating blade rotates out of contact with the processing liquid, the substrate is not shocked or stressed. Accordingly, there is no likelihood of the substrate being damaged.

According to an another aspect of the present invention, the rotating shaft of the rotating blade and the rotor of a motor for driving the rotating blade may be supported in a magnetic levitation manner with magnetic bearings. Therefore, there is no possibility that the substrate or the processing space will be contaminated with particles or the like that would otherwise be generated by friction.

According to a further aspect of the present invention, the substrate processing apparatus may further include a step or device for moving the rotating blade in parallel to the substrate. Therefore, by moving the rotating blade parallel to the substrate, the mass of processing liquid formed on the substrate surface below the rotating blade also moves on the substrate surface as the rotating blade moves. Therefore, even a large-sized substrate can be uniformly processed over the whole surface thereof.

According to a further aspect of the present invention, the rotating blade may be a planar disk. Therefore, it is easy to form a mass of processing liquid having a circulating current therein on the substrate surface below the rotating blade.

It should be noted that the present invention is not necessarily limited to the foregoing embodiments but can be modified in a variety of ways.

What is claimed is:

1. A substrate processing method for processing a surface of a substrate with a processing liquid, said substrate processing method comprising the steps of;

disposing a rotating blade above the horizontally placed substrate so as to face said substrate;

supplying the processing liquid to the surface of said substrate; and rotating said rotating blade while keeping it out of contact with said processing liquid to induce a gas current over said processing liquid, so that said gas current forms from said processing liquid a mass of processing liquid having an internal circulating current on the surface of said substrate.

2. A substrate processing method according to claim 1, further comprising:

a step of moving said rotating blade in parallel to said substrate and whereby moving said mass of processing liquid on the surface of said substrate along with movement of said rotating blade.

3. A substrate processing apparatus for processing a surface of a substrate with a processing liquid, said substrate processing apparatus comprising:

a rotating blade disposed above the horizontally placed substrate so as to face said substrate;

means for supplying the processing liquid to the surface of said substrate; and means for rotating said rotating blade while keeping it out of contact with said processing liquid, said rotating blade is being so configured, spaced apart from said surface of said substrate and rotated by said rotating means, that it induces a gas current over said processing liquid, said gas current forming from said processing liquid a mass of processing liquid having an internal circulating current on the surface of said substrate.

4. A substrate processing apparatus according to claim 3, wherein said means for rotating said rotating blade is a motor, and wherein a rotor of said motor and a rotating shaft of said rotating blade are supported with magnetic bearings.

5. A substrate processing apparatus according to either one of claims 3 and 4, further comprising:

means for moving said rotating blade parallel to said substrate.

6. A substrate processing apparatus according to any one of claim 3 or claim 4 wherein said rotating blade is a planar disk.

* * * * *